(12) United States Patent
Na et al.

(10) Patent No.: US 12,278,260 B2
(45) Date of Patent: Apr. 15, 2025

(54) CAPACITOR AND SEMICONDUCTOR DEVICE INCLUDING THE SAME

(71) Applicant: Samsung Electronics Co., Ltd., Suwon-si (KR)

(72) Inventors: Byunghoon Na, Suwon-si (KR); Kiyoung Lee, Seoul (KR); Jooho Lee, Hwaseong-si (KR); Myoungho Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 478 days.

(21) Appl. No.: 17/407,653

(22) Filed: Aug. 20, 2021

(65) Prior Publication Data
US 2022/0238634 A1    Jul. 28, 2022

(30) Foreign Application Priority Data

Jan. 26, 2021   (KR) .................. 10-2021-0011037

(51) Int. Cl.
*H01G 4/30* (2006.01)
*H01L 49/02* (2006.01)
*H10N 70/00* (2023.01)
*H10N 70/20* (2023.01)

(52) U.S. Cl.
CPC ............ *H01L 28/56* (2013.01); *H01G 4/30* (2013.01); *H01L 28/65* (2013.01); *H01L 28/75* (2013.01); *H10N 70/231* (2023.02); *H10N 70/841* (2023.02)

(58) Field of Classification Search
CPC ......... H01L 28/56; H01L 28/65; H01L 28/75; H01L 28/55; H01L 28/60; H01G 4/30; H01G 4/1236; H01G 4/1254; H01G 4/008; H01G 4/1209; H01G 4/1218; H01G 4/33;
(Continued)

(56) References Cited

U.S. PATENT DOCUMENTS

| 6,060,735 A | 5/2000 | Izuha et al. |
| 6,151,240 A | 11/2000 | Suzuki |
| 7,456,456 B2 | 11/2008 | Itokawa et al. |

(Continued)

FOREIGN PATENT DOCUMENTS

| EP | 1675162 A2 | 6/2006 |
| JP | H8-335672 A | 12/1996 |

(Continued)

OTHER PUBLICATIONS

Ho Nyung Lee et al., "Thermal stability of epitaxial SrRuO3 films as a function of oxygen pressure," Appl. Phys. Lett. vol. 84, No. 20, pp. 4107-4109, May 17, 2004.
(Continued)

*Primary Examiner* — Caleen O Sullivan
(74) *Attorney, Agent, or Firm* — Harness, Dickey & Pierce, P.L.C.

(57) ABSTRACT

A capacitor includes a first electrode including a first reinforcement material having a perovskite crystal structure; and a first metallic material having a perovskite crystal structure; a second electrode on the first electrode; and a dielectric layer between the first electrode and the second electrode, wherein the first metallic material has greater a greater electronegativity than that of the first reinforcement material.

8 Claims, 19 Drawing Sheets

(58) Field of Classification Search
CPC .... H10N 70/231; H10N 70/841; H10B 53/30; H10B 53/00; H10B 12/30
USPC .......................................................... 257/310
See application file for complete search history.

(56) References Cited

U.S. PATENT DOCUMENTS

| | | |
|---|---|---|
| 2003/0151078 A1 | 8/2003 | Tanaka et al. |
| 2004/0109280 A1 | 6/2004 | Moon et al. |
| 2004/0238861 A1* | 12/2004 | Hwang .................. H01L 28/75 257/295 |
| 2009/0225493 A1 | 9/2009 | Kiyomura |
| 2019/0237265 A1 | 8/2019 | Radetinac et al. |
| 2020/0321344 A1 | 10/2020 | Ramamoorthy et al. |

FOREIGN PATENT DOCUMENTS

| | | |
|---|---|---|
| JP | 3347010 B2 | 11/2002 |
| JP | 4095582 B2 | 6/2008 |
| KR | 10-1999-0030835 A | 5/1999 |
| KR | 10-2018-0109309 A | 10/2018 |
| WO | WO-2019/005143 A1 | 1/2019 |

OTHER PUBLICATIONS

Junsoo Shin et al., "Surface stability of epitaxial SrRuO3 films," Surface Science 581 pp. 118-132, Mar. 13, 2005.

A.R. Akbashev et al., "Activation of ultrathin SrTiO3 with subsurface SrRuO3 for the oxygen evolution reaction," Energy Environ. Sci., 11, pp. 1762-1769, Apr. 10, 2018.

Extended European Search report issued on Jun. 27, 2022 in European Application No. 21214455.4.

Marcos Verissimo-Alves, et al., "Highly-confined spin-polarized two-dimensional electron gas in SrTiO3/SrRuO3 superlattices," PRL 108,107003, Jan. 14, 2012.

* cited by examiner

CAPACITOR AND SEMICONDUCTOR DEVICE INCLUDING THE SAME

CROSS-REFERENCE TO RELATED APPLICATION

This application is based on and claims priority under 35 U.S.C. § 119 to Korean Patent Application No. 10-2021-0011037, filed on Jan. 26, 2021, in the Korean Intellectual Property Office, the disclosure of which is incorporated by reference herein in its entirety.

BACKGROUND

1. Field

The present disclosure relates to a capacitor and a semiconductor device including the capacitor.

2. Description of the Related Art

Oxides having a perovskite crystal structure have high permittivity, and are thus attracting attention as materials used for dielectric layers of next-generation capacitors. In order for a dielectric layer having a perovskite crystal structure to maintain high permittivity, the perovskite crystal structure needs to remain stable. The crystallinity of a dielectric layer is influenced by an electrode of a capacitor.

As electrode materials for a capacitor, noble metals such as Ru, Ir, Pt, and Au and a material having a perovskite crystal structure and metallic properties are being studied. When an electrode formed of a noble metal or a material having a perovskite crystal structure and metallic properties is used as the electrode of a capacitor, a perovskite crystal structure of the dielectric layer may not remain stable.

SUMMARY

Provided are electrodes maintaining a stable perovskite crystal structure.

Provided are dielectric layers maintaining a stable perovskite crystal structure.

Provided are dielectric layers having high permittivity.

Provided are capacitors having improved capacitance characteristics.

Provided are semiconductor devices including capacitors having improved capacitance characteristics.

However, objects to be resolved are not limited to the above disclosure.

Additional aspects will be set forth in part in the description which follows and, in part, will be apparent from the description, or may be learned by practice of the presented embodiments of the disclosure.

According to an aspect of an embodiment, a capacitor includes a first electrode; a second electrode on the first electrode including a first reinforcement material having a perovskite crystal structure; and a first metallic material having a perovskite crystal structure; and a dielectric layer between the first electrode and the second electrode, wherein the first metallic material has a greater electronegativity that than that of the first reinforcement material.

The electronegativity of the first metallic material may be at least about 0.6 greater than that of the first reinforcement material.

The first reinforcement material may have dielectric properties.

The first reinforcement material may include a composition of $ABO_3$, and/or the first metallic material may include a composition of $A'B'O_3$, where A and A' each independently include at least one of K, Sr, Ba, Ca, Pb, or La, B includes at least one of Ti, Hf, Zr, Sn, or Al, B' includes at least one of Ru, Mo, Ir, V, Hf, Zr, Sn, or Al, and O represents oxygen.

The first electrode may have a superlattice structure including first unit layers and second unit layers that are alternately stacked, wherein the first unit layers may include the first reinforcement material, and the second unit layers may include the first metallic material.

At least one of a lowermost layer or an uppermost layer of the first electrode may be a first unit layer.

The first electrode may include an alloy of the first reinforcement material and the first metallic material, and the alloy may have a perovskite crystal structure.

The dielectric layer may include a first dielectric material having a perovskite crystal structure.

The dielectric layer may further comprise a second dielectric material having a perovskite crystal structure, wherein the second dielectric material and the first dielectric material may have different dielectric characteristics.

The dielectric layer may have a superlattice structure including first dielectric layers and second dielectric layers that are alternately stacked, wherein the second dielectric layers may include the second dielectric material, and the first dielectric layers may include the first dielectric material.

The first dielectric material may have ferroelectricity or paraelectricity.

The second electrode may include a second reinforcement material having a perovskite crystal structure; and a second metallic material having a perovskite crystal structure, wherein the second metallic material may have greater electronegativity than that of the second reinforcement material.

The second reinforcement material may have dielectric properties

The electronegativity of the second metallic material may be at least 0.6 greater than that of the second reinforcement material.

The second electrode may have a superlattice structure including third unit layers and fourth unit layers that are alternately stacked, wherein the third unit layers may include the second reinforcement material, and the fourth unit layers may include the second metallic material.

At least one of a lowermost layer or an uppermost layer of the second electrode may be a third unit layer.

The second electrode may include an alloy of the second reinforcement material and the second metallic material, and may the alloy may have a perovskite crystal structure.

The second reinforcement material may be identical to the first reinforcement material.

The second metallic material may be identical to the first metallic material.

The capacitor may further include a seed layer on an opposite side of the first electrode with respect to the dielectric layer.

According to an aspect of another embodiment, a semiconductor device includes a capacitor including a first electrode including a first reinforcement material having a perovskite crystal structure and a first metallic material having a perovskite crystal structure, a second electrode on the first electrode, and a dielectric layer between the first electrode and the second electrode; and a transistor including a first source/drain region electrically connected to the first electrode, a second source/drain region, and a gate structure between the first source/drain region and the second source/drain region, wherein the first metallic material may have a greater electronegativity than that of the first reinforcement material.

Electronegativity of the first metallic material may be at least 0.6 greater than that of the first reinforcement material.

The first electrode may have a superlattice structure including first unit layers and second unit layers that are alternately stacked, wherein the first unit layers may include the first reinforcement material, and the second unit layers may include the first metallic material.

The first electrode may include an alloy of the first reinforcement material and the first metallic material.

The second electrode may include a second reinforcement material having a perovskite crystal structure; and a second metallic material having a perovskite crystal structure, wherein the second metallic material may have a greater electronegativity than that of the second reinforcement material.

Electronegativity of the second metallic material may be at least 0.6 greater than that of the second reinforcement material.

The second electrode may have a superlattice structure including third unit layers and fourth unit layers that are alternately stacked, wherein the third unit layers may include the second reinforcement material, and the fourth unit layers may include the second metallic material.

The second electrode may include an alloy of the second reinforcement material and the second metallic material.

The second reinforcement material may be identical to the first reinforcement material.

The second metallic material may be identical to the first metallic material.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
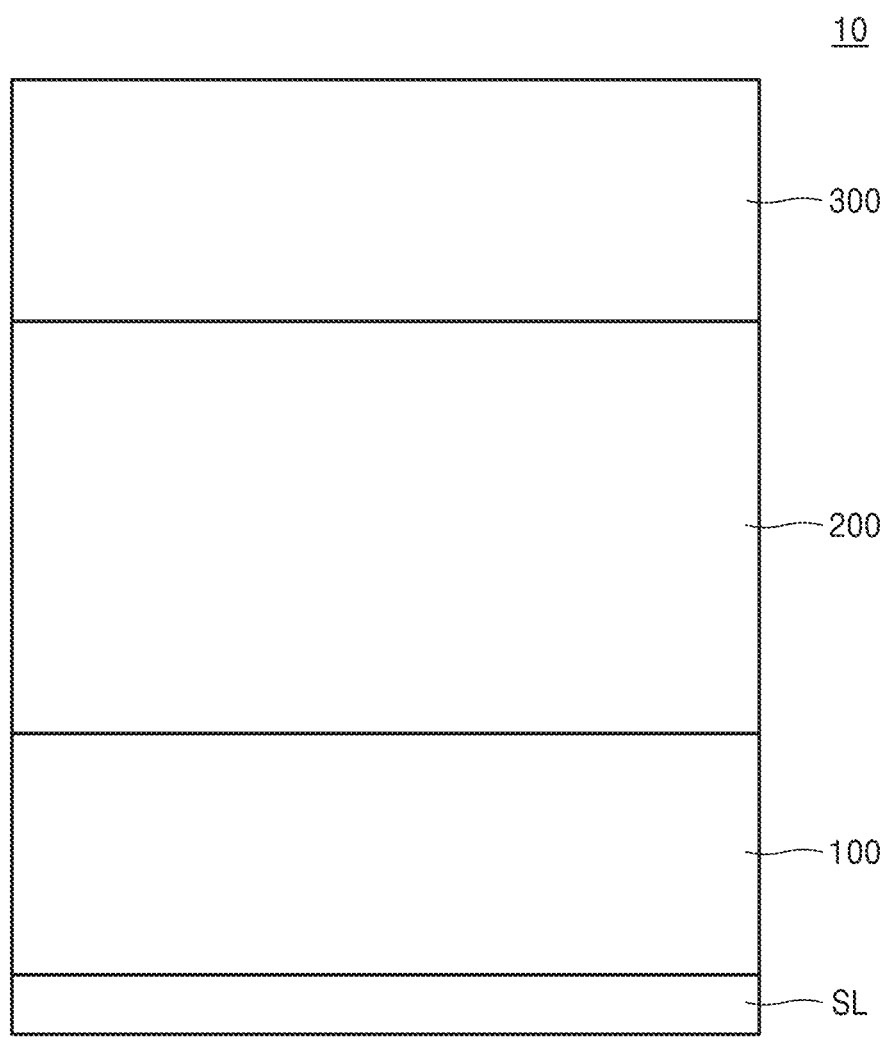
FIG. 1 is a cross-sectional view of a capacitor according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to drawings. Like reference numerals in the drawings denote like elements, and, in the drawings, the sizes of elements may be exaggerated for clarity and for convenience of explanation. The present embodiments may have different forms and should not be construed as being limited to the descriptions set forth herein.

Spatially relative terms, such as "above" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly. Additionally, it will be understood that when a layer is referred to as being "on" another layer or substrate, it can be directly on the other layer or substrate, or intervening layers may also be present.

An expression used in the singular encompasses the expression of the plural, unless it has a clearly different meaning in the context. Also, when a component "includes" an element, unless there is another opposite description thereto, it should be understood that the component does not exclude another element but may further include another element.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a cross-sectional view of a capacitor 10 according to some example embodiments.

Referring to FIG. 1, provided may be a capacitor 10. The capacitor 10 may include a seed layer SL, a first A electrode 100, a first dielectric layer 200, and a second A electrode 300. The seed layer SL may be a seed layer SL for forming a layer having a perovskite crystal structure. The seed layer SL may include a conductive material. For example, the seed layer SL may include $TiO_2$ or $SrO_2$.

The first A electrode 100 may be provided on the seed layer SL. The first A electrode 100 may have a perovskite crystal structure. The first A electrode 100 may include a first reinforcement material having a perovskite crystal structure and a first metallic material having a perovskite crystal structure. In some embodiments, the first reinforcement material may have dielectric properties, and/or the first metallic material may have conductive properties. For example, a band gap may exist between the valence band and the conductive band of the first reinforcement material.

The electronegativity of the first metallic material may be greater than that of the first reinforcement material. For example, the electronegativity of the first metallic material may be at least about 0.6 greater than that of the first reinforcement material. The first reinforcement material may be represented by $ABO_3$ (where O is oxygen) and may have dielectric properties. $ABO_3$ may represent a perovskite oxide, and may represent at least one of a 1:2 perovskite, a 2:4 perovskite, a 3:3: perovskite, and/or a 1:5 perovskite. A may represent a larger cation, and may be, for example, at least one of Ca, Pb, La, Ba and/or Sr. B may represent a smaller cation (e.g., as compared to A) and may be, for example, at least one of Hf, Zr, Sn, Al, and/or Ti. For example, the first reinforcement material may include $BaTiO_3$ and/or $SrTiO_3$.

The first metallic material may be represented by $A'B'O_3$ (where O is oxygen) and may have metallic properties. For example, the electronic state of the first metallic material may be similar to that of a metallic electron state, and therefore the first metallic material may also be referred to as a first "conductive material." In some embodiments, $A'B'O_3$ may represent a perovskite oxide, and may represent at least one of a 1:2 perovskite, a 2:4 perovskite, a 3:3: perovskite, and/or a 1:5 perovskite. A' may represent a larger cation, and may be, for example, at least one of Ca, Pb, La, Ba, and/or Sr. B' may represent a smaller cation (e.g., as compared to A'), and may be, for example, at least one of Hf, Zr, Sn, Al, Ru, Mo, Ir, and/or V. For example, the first metallic material may include $BaRuO_3$, $BaMoO_3$, $BaIrO_3$, $BaVO_3$, $SrRuO_3$, $SrMoO_3$, $SrIrO_3$, and/or $SrVO_3$. In some embodiments, A and A' may be the same or different elements; and/or B and B' may be selected such that the electronegativity of B and/or $ABO_3$ is, respectively, greater than B' and/or $A'B'O_3$.

The first dielectric layer 200 may be provided on the first A electrode 100. The first dielectric layer 200 may have a perovskite crystal structure and dielectric properties. For example, the first dielectric layer 200 may be represented by $A''B''O_3$ (where O is oxygen). $A''B''O_3$ may represent a perovskite oxide, and may represent at least one of a 1:2 perovskite, a 2:4 perovskite, a 3:3: perovskite, and/or a 1:5 perovskite. In some embodiments, the first dielectric layer 200 may have ferroelectric characteristics and/or paraelectric characteristics. When the first dielectric layer 200 has ferroelectric characteristics, for example, the first dielectric layer 200 may include $BaTiO_3$, $KNbO_3$, $KTaO_3$, $PbTiO_3$, and/or PbZrO. When the first dielectric layer 200 has paraelectric characteristics, for example, the first dielectric layer 200 may include $SrTiO_3$, $CaTiO_3$, $SrHfO_3$, and/or $SrZrO_3$.

The second A electrode 300 may be provided on the first dielectric layer 200. The second A electrode 300 may have a perovskite crystal structure. The second A electrode 300 may include a second reinforcement material having a perovskite crystal structure and a second metallic material having a perovskite crystal structure. The electronegativity of the second metallic material may be greater than that of the second reinforcement material. For example, the electronegativity of the second metallic material may be at least about 0.6 greater than that of the second reinforcement material. The second reinforcement material may be represented by $ABO_3$ (where O is oxygen) and may have dielectric properties. For example, $ABO_3$ may represent a perovskite oxide, and may represent at least one of a 1:2 perovskite, a 2:4 perovskite, a 3:3: perovskite, and/or a 1:5 perovskite. A may represent a larger cation, and may be, for example, at least one of Ca, Pb, La, Ba and/or Sr. B may represent a smaller cation (e.g., as compared to A) and may be, for example, at least one of Hf, Zr, Sn, Al, and/or Ti. The second reinforcement material may include $BaTiO_3$ and/or $SrTiO_3$. For example, the second reinforcement material may substantially be identical to the first reinforcement material.

The second metallic material may be represented by $A'B'O_3$ (where O is oxygen) and may have metallic properties. $A'B'O_3$ may represent a perovskite oxide, and may represent at least one of a 1:2 perovskite, a 2:4 perovskite, a 3:3: perovskite, and/or a 1:5 perovskite. A' may represent larger cation, and may be, for example, at least one of Ca, Pb, La, Ba, and/or Sr. B' may represent a smaller cation (e.g., as compared to A'), and may be, for example, at least one of Hf, Zr, Sn, Al, Ru, Mo, Ir, and/or V. For example, the second metallic material may include $BaRuO_3$, $BaMoO_3$, $BaIrO_3$, $BaVO_3$, $SrRuO_3$, $SrMoO_3$, $SrIrO_3$, and/or $SrVO_3$. For example, the second metallic material may substantially be identical to the first metallic material.

Dielectric characteristics of the first dielectric layer 200, having a perovskite crystal structure, may change according to crystallinity of the first dielectric layer 200. For example, when the crystallinity of the first dielectric layer 200 is low, dielectric characteristics may be deteriorated, and when the crystallinity of the first dielectric layer 200 is high, dielectric characteristics may be maintained. The crystallinity of the first dielectric layer 200 may be influenced by crystallinity of the first A electrode 100 having a perovskite crystal structure and/or the second A electrode 300 having a perovskite crystal structure. For example, when the crystallinity of the first A electrode 100 and/or the second A electrode 300 is low, crystallinity of the first dielectric layer 200 may decrease, and when the crystallinity of the first A electrode 100 and/or the second A electrode 300 is high, crystallinity of the first dielectric layer 200 may also increase. Therefore, in order to maintain high permittivity of the first dielectric layer 200, it may be beneficial when the crystallinity of the first A electrode 100 and the second A electrode 300 is high.

Since a material of a perovskite crystal structure having metallic properties (e.g., $SrRuO_3$) has low electric resistance and high work function, the material may have appropriate electrical characteristics to be used as an electrode of a capacitor. However, in the material of a perovskite crystal structure having metallic properties, the perovskite crystal structure may be collapsed by an external environment. For example, the perovskite crystal structure may be easily changed to a crystal structure other than a perovskite crystal structure due to the high oxidation/reduction reactivity of the material of the perovskite crystal structure having metallic properties.

The first A electrode 100, according to some embodiments may include a first reinforcement material having a perovskite crystal structure and a first metallic material having a perovskite crystal structure and an electronegativity greater (e.g., at least about 0.6 greater) than that of the first reinforcement material. The second A electrode 300 may include a second reinforcement material having a perovskite crystal structure and a second metallic material having a perovskite crystal structure and electronegativity greater (e.g., at least about 0.6 greater) than that of the second reinforcement material. In some embodiments, the thickness of the capacitor 10 may be greater than and/or equal to 50 Å (angstrom).

The first reinforcement material and the second reinforcement material may themselves have high crystallinity The first reinforcement material and the second reinforcement material may reinforce an O-B'-O octahedral bonding in the first metallic material and the second metallic material, each represented by A'B'O$_3$.

Due to the reinforcement of the O-B'-O octahedral bonding, the first metallic material and the second metallic material may have high crystallinity. For example, without being limited to a particular theory, due to the first reinforcement material and the second reinforcement material, crystallinity of each of the first metallic material and the second metallic material may be improved. As the first dielectric material and the first metallic material both have high crystallinity, the first A electrode 100 may have high crystallinity. As the second dielectric material and the second metallic material both have high crystallinity, the second A electrode 300 may have high crystallinity. Accordingly, the first dielectric layer 200 may have high crystallinity and high permittivity. The capacitor 10 according to an embodiment may have improved capacitance characteristics. For example, the improved capacitance characteristics may include the dielectric constant, the dissipation factor, and/or the leakage current density (leakage current). For example, in some example embodiments, the dissipation factor may be reduced by 20% or more without decreasing the dielectric constant of the dielectric layer 200, and the leakage current density is improved from +/−1 MV/cm field to a minimum of 1 order and/or up to 3 orders.

In some of the embodiments, a ratio of the first metallic material (and/or the second metallic material) and the first reinforcement material (and/or the second reinforcement material) in at least one of the first A electrode 100 or second A electrode 300 may be adjusted so that the first A electrode 100 or second A electrode 300 may have semiconductive properties. In these example embodiments, for example, at least one of the first A electrode 100 and/or the second A electrode 300 may be a gate electrode in a transistor and the other may be a channel layer. Thereby the capacitor 10 may be included in a field effect transistor as a gate capacitor. A first source/drain region and a second source/drain region (not illustrated) may be included on opposite sides of the gate capacitor and/or separated from each other in a direction parallel to a top surface of the capacitor 10.

Figure 2:
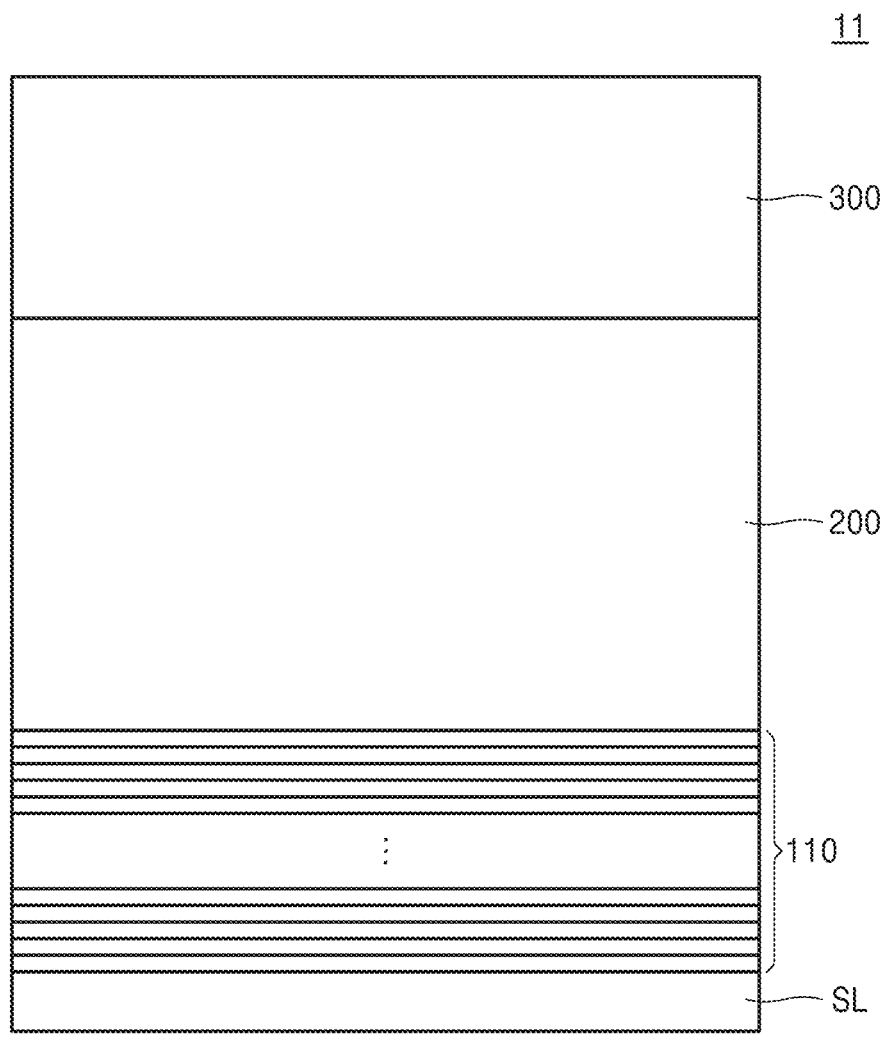
FIG. 2 is a cross-sectional view of a capacitor according to some example embodiments.

FIG. 2 is a cross-sectional view of a capacitor 11 according to some example embodiments. For briefness of descriptions, substantially the same description as those described with reference to FIG. 1 will be omitted.

Referring to FIG. 2, provided may be a capacitor 11. The capacitor 11 may include a seed layer SL, a first B electrode 110, a first dielectric layer 200, and a second A electrode 300. The seed layer SL, first dielectric layer 200, and second A electrode 300 may be substantially the same with the seed layer SL, first dielectric layer 200, and second A electrode 300 described with reference to FIG. 1, each respectively.

The first B electrode 110 may include the first reinforcement material and the first metallic material described with reference to FIG. 1. The first B electrode 110 may have a superlattice structure including first unit layers and second unit layers that are alternately stacked. For example, the superlattice structure may be a structure in which heterogeneous layers having a thickness of several nanometers are alternately stacked. In some embodiments, each unit layer may be one or more unit cells thick and/or the first B electrode 110 may include two or more cycles. The first unit layers may be the first reinforcement material layers. The second unit layers may be the first metallic material layers.

The superlattice structure may have conductive properties due to the overlapping density states of the alternating cell units. For example, without being limited to a particular theory, in some embodiments, a 4d state of the B' cation may be located in the middle of the band gap of the reinforcement material, thereby facilitating charge carrier transport across the band gap.

In one embodiment, at least one of the lowermost layer and the uppermost layer of the superlattice structure may be a first unit layer. For example, each of the lowermost layer and the uppermost layer of the superlattice structure may be a first unit layer. A second unit layer may be disposed between a pair of first unit layers adjacent to the second unit layer. In some embodiments, the lowermost layer and the uppermost layer of the superlattice structure may both be a second unit layer.

The bond to the oxygen element in the second unit layers may be unstable and thus the oxygen may have a tendency of leaving the perovskite crystal structure. When the oxygen element leaves the structure, the perovskite crystal structure may collapse. The first unit layers may have electrically stable characteristics. When the first unit layers are disposed adjacent to the second unit layer, oxygen element in the second unit layer may not flow into the electrically stable first unit layer. The oxygen element in the second unit layer may remain in the perovskite crystal structure.

The first unit layers according to another embodiment may improve crystallinity of the second unit layers. In this regard, the first B electrode 110 may have high crystallinity. The first dielectric layer 200 may have high crystallinity and high permittivity. The capacitor 11 of the present embodiment may have improved capacitance characteristics.

Figure 3:
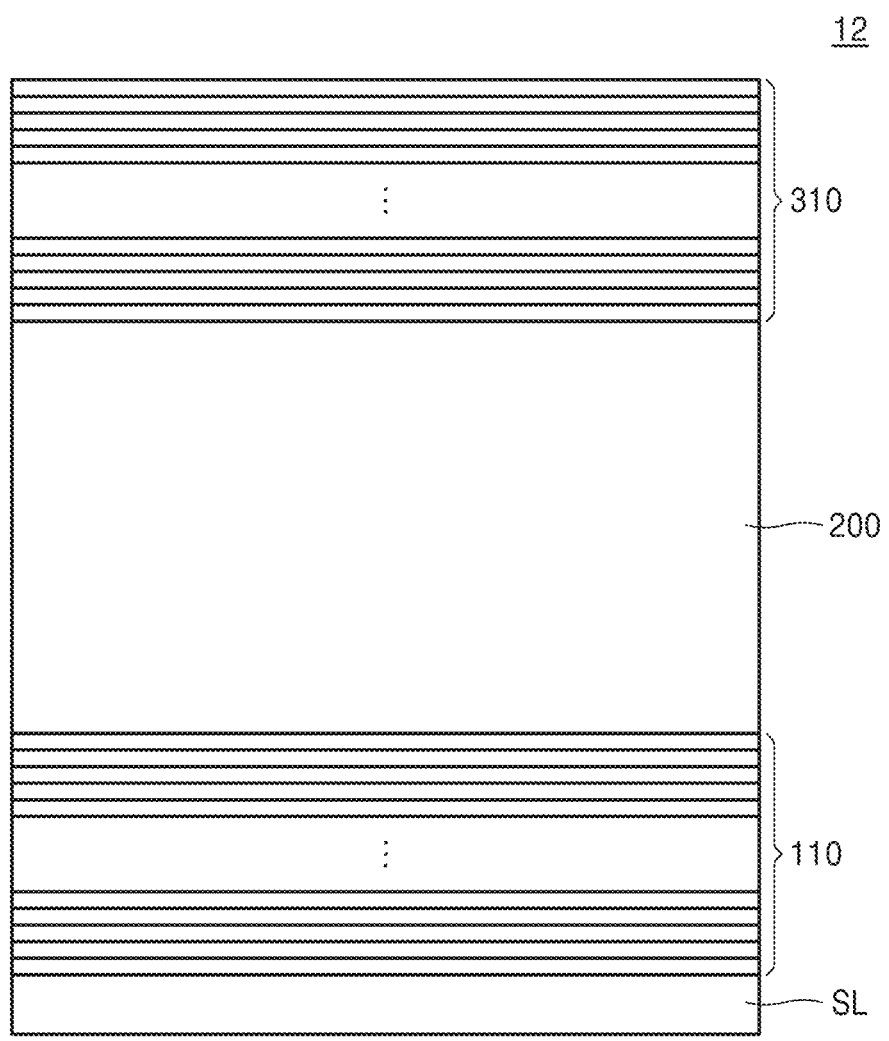
FIG. 3 is a cross-sectional view of a capacitor according to some example embodiments.

FIG. 3 is a cross-sectional view of a capacitor 12 according to some example embodiments. For briefness of descriptions, substantially the same description as those described with reference to FIGS. 1 and 2 will be omitted.

Referring to FIG. 3, provided may be a capacitor 12. The capacitor 12 may include a seed layer SL, a first B electrode 110, a first dielectric layer 200, and a second B electrode 310. The seed layer SL and the first dielectric layer 200 may be substantially the same with the seed layer SL and the first dielectric layer 200 described with reference to FIG. 1, each respectively. The first B electrode 110 may be substantially the same with the first B electrode 110 described with reference to FIG. 2.

The second B electrode 310 may include the first reinforcement material and the first metallic material described with reference to FIG. 1. The second B electrode 310 may include a superlattice structure including first unit layers and second unit layers that are alternately stacked. The first unit layers may be first reinforcement material layers. The second unit layers may be first metallic material layers.

In some embodiments, at least one of the lowermost layer and the uppermost layer of the superlattice structure may be a first unit layer. For example, each of the lowermost layer and the uppermost layer of the superlattice structure may be a first unit layer. For example, a second unit layer may be disposed between a pair of first unit layers adjacent to the second unit layer. In some embodiments, the lowermost layer and the uppermost layer of the superlattice structure may both be a second unit layer.

The first unit layers according to another embodiment may improve crystallinity of the second unit layers. In this regard, the second B electrode 310 may have high crystallinity. The first dielectric layer 200 may have high crystallinity and high permittivity. The capacitor 12 of the present embodiment may have improved capacitance characteristics.

Figure 4:
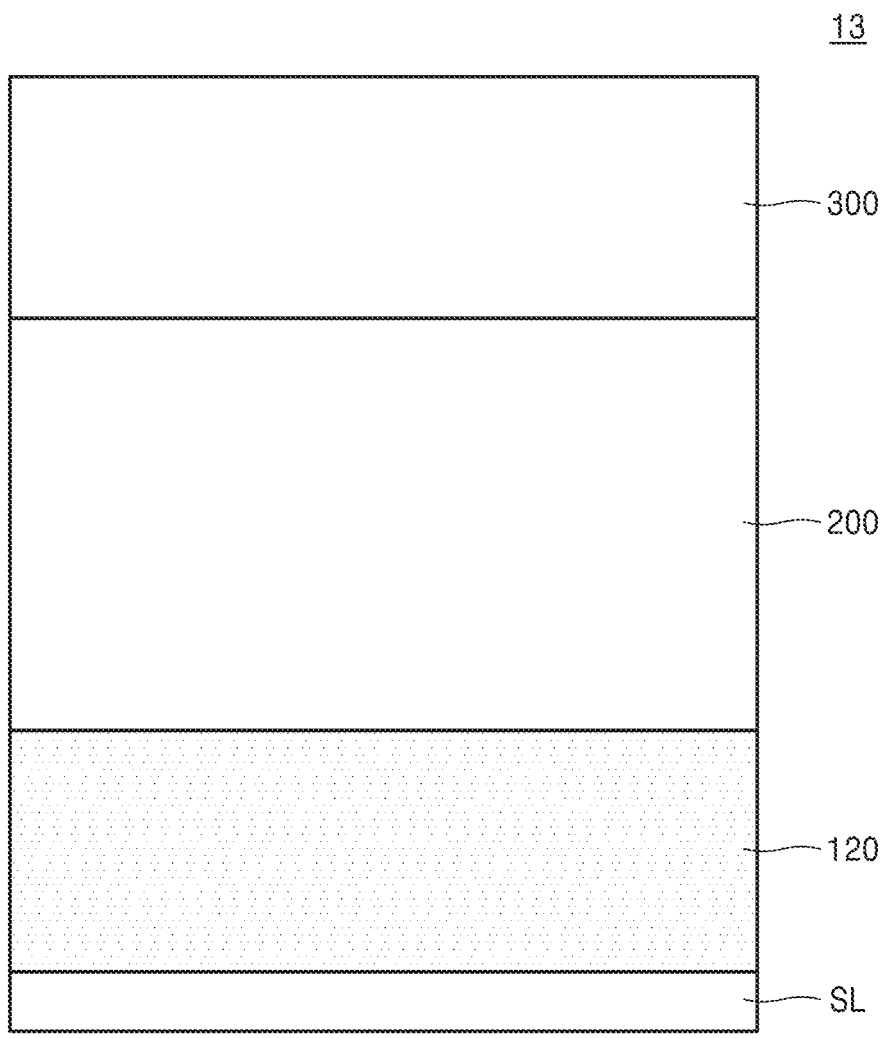
FIG. 4 is a cross-sectional view of a capacitor according to some example embodiments.

FIG. 4 is a cross-sectional view of a capacitor 13 according to some example embodiments. For briefness of descriptions, substantially the same description as those described with reference to FIG. 1 will be omitted.

Referring to FIG. 4, provided may be a capacitor 13. The capacitor 13 may include a seed layer SL, a first C electrode 120, a first dielectric layer 200, and a second A electrode 300. The seed layer SL, first dielectric layer 200, and second A electrode 300 may be substantially the same with the seed layer SL, first dielectric layer 200, and second A electrode 300 described with reference to FIG. 1, each respectively.

The first C electrode 120 may include the first reinforcement material and the first metallic material described with reference to FIG. 1. The first C electrode 120 may include an alloy of the first reinforcement material and the first metallic material. The first C electrode 120 may have a perovskite crystal structure. The first C electrode 120 may be represented by $A_xA'_{(1-x)}BO_3$, $AB_yB'_{(1-y)}O_3$, and/or $A_xA'_{(1-x)}B_yB'_{(1-y)}O_3$ (where O is an oxygen atom). For example, the first C electrode 120 may include a perovskite structure wherein A is periodically replaced with A' (and/or vice versa), and/or B is periodically replaced with B' (and/or vice versa). In some embodiments, in $A_xA'_{(1-x)}BO_3$, $AB_yB'_{(1-y)}O_3$, and/or $A_xA'_{(1-x)}B_yB'_{(1-y)}O_3$, x and/or y may each, independently, be 0.5 or less.

Due to the first reinforcement material in the first C electrode 120, crystallinity of the first metallic material may be improved. Since the first reinforcement material and the first metallic material both have high crystallinity, the first C electrode 120 may also have high crystallinity. In this regard, the first dielectric layer 200 may have high crystallinity and high permittivity. The capacitor 13 of the present embodiment may have improved capacitance characteristics.

Figure 5:
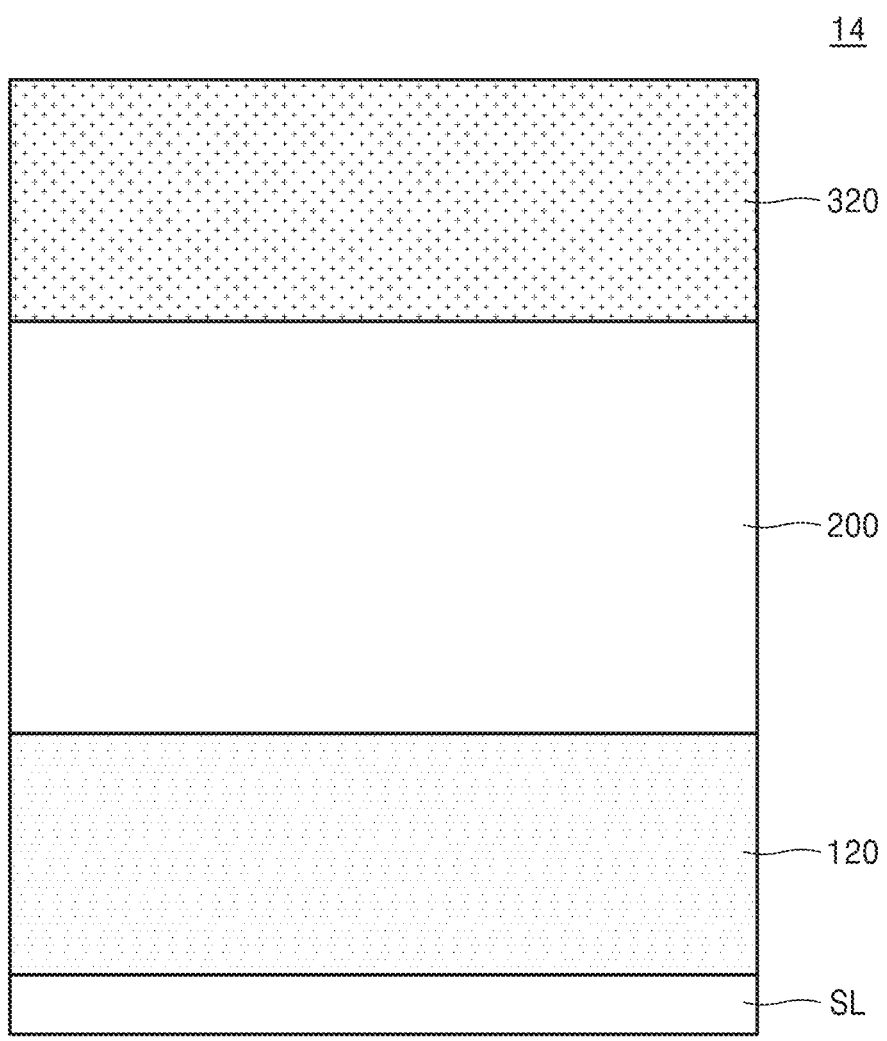
FIG. 5 is a cross-sectional view of a capacitor according to some example embodiments.

FIG. 5 is a cross-sectional view of a capacitor 14 according to some example embodiments. For briefness of descriptions, substantially the same description as those described with reference to FIGS. 1 and 4 will be omitted.

Referring to FIG. 5, provided may be a capacitor 14. The capacitor 14 may include a seed layer SL, a first C electrode 120, a first dielectric layer 200, and a second C electrode 320. The seed layer SL and the first dielectric layer 200 may be substantially the same with the seed layer SL and the first dielectric layer 200 described with reference to FIG. 1, each respectively. The first C electrode 120 may be substantially the same with the first C electrode 120 described with reference to FIG. 4.

The second C electrode 320 may include the second reinforcement material and the second metallic material described with reference to FIG. 1. The second C electrode 320 may include an alloy of the second reinforcement material and the second metallic material. The second C electrode 320 may have a perovskite crystal structure. The second C electrode 320 may be represented by $A_xA'_{(1-x)}BO_3$, $AB_yB'_{(1-y)}O_3$, or $A_xN_{(1-x)}B_yB'_{(1-y)}O_3$ (where O is an oxygen atom). In some embodiments, in $A_xA'_{(1-x)}BO_3$, $AB_yB'_{(1-y)}O_3$, and/or $A_xA'_{(1-x)}B_yB'_{(1-y)}O_3$, x and/or y may each, independently, be 0.5 or less.

Due to the second reinforcement material in the second C electrode 320, crystallinity of the second metallic material may be improved. Since the second reinforcement material and the second metallic material both have high crystallinity, the second C electrode 320 may also have high crystallinity. In this regard, the second dielectric layer 210 may have high crystallinity and high permittivity. The capacitor 14 of the present embodiment may have improved capacitance characteristics.

Figure 6:
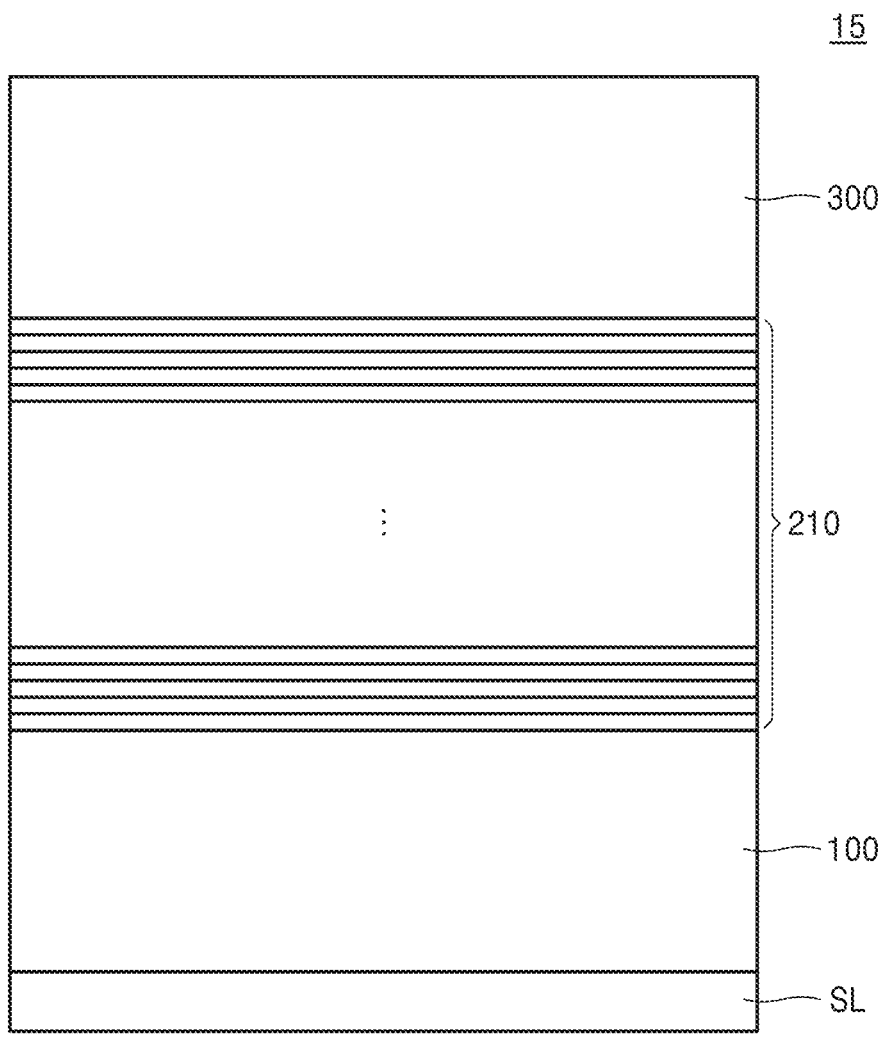
FIG. 6 is a cross-sectional view of a capacitor according to some example embodiments.

FIG. 6 is a cross-sectional view of a capacitor 15 according to some example embodiments. For briefness of descriptions, substantially the same description as those described with reference to FIG. 1 will be omitted.

Referring to FIG. 6, provided may be a capacitor 15. The capacitor 15 may include a seed layer SL, a first A electrode 100, a second dielectric layer 210, and a second A electrode 300. The seed layer SL, first A electrode 100, and second A electrode 300 may be substantially the same as the seed layer SL, first A electrode 100, a first B electrode 110, a first C electrode 120, the second A electrode 300, second B electrode 310, and/or the second C electrode 320 described with reference to FIGS. 1 to 5, respectively.

The second dielectric layer 210 may have a superlattice structure including first unit layers and second unit layers that are alternately stacked. The first unit layers and the second unit layers may have dielectric characteristics different from each other. For example, the first unit layers may include a ferroelectric material having a perovskite crystal structure. For example, the second unit layers may include a paraelectric material including a perovskite crystal structure.

Due to the first reinforcement material in, e.g., the first A electrode 100, crystallinity of the first metallic material may be improved. Since the first reinforcement material and the first metallic material both have high crystallinity, the first A electrode 100 may also have high crystallinity. Due to the second reinforcement material in, e.g., the second A electrode 300, crystallinity of the second metallic material may be improved. Since the second reinforcement material and the second metallic material both have high crystallinity, the second A electrode 300 may also have high crystallinity. In this regard, the second dielectric layer 210 may have high crystallinity and high permittivity. The capacitor 15 of the present embodiment may have improved capacitance characteristics.

Figure 7:
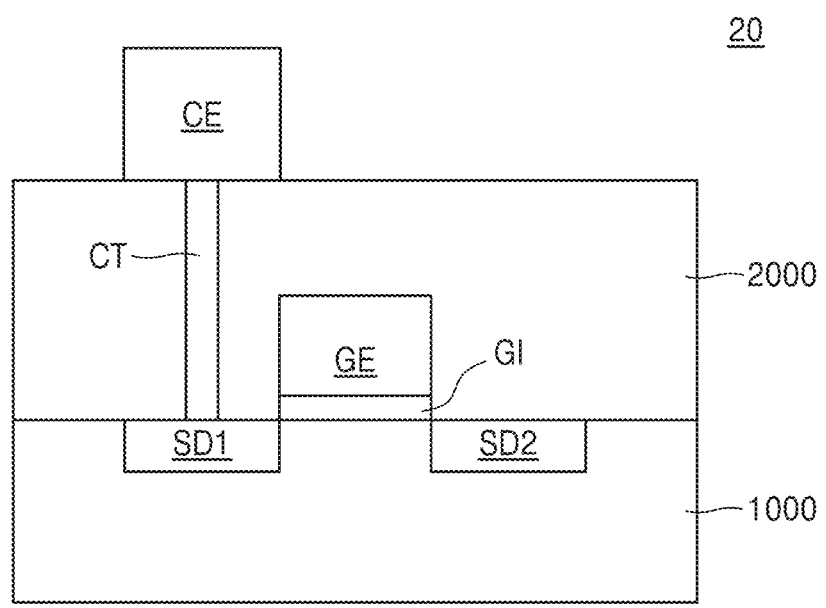
FIG. 7 is a cross-sectional view of a semiconductor device according to some example embodiments.

FIG. 7 is a cross-sectional view of a semiconductor device 20 according to some example embodiments. For briefness of descriptions, substantially the same description as those described with reference to FIGS. 1 to 6 will be omitted.

Referring to FIG. 7, provided may be a semiconductor device 20 including a substrate 1000, a gate electrode GE, a gate insulating layer GI, an interlayer insulating layer 2000, a contact CT, and a capacitor CE. The substrate 1000 may include a semiconductor substrate. For example, the substrate 1000 may include a silicon substrate, a germanium substrate, or a silicon-germanium substrate.

A first source/drain region SD1 and a second source/drain region SD2 may be provided on the substrate 1000. The first and second source/drain regions SD1 and SD2 may be separated from each other in a direction parallel to a top surface of the substrate 1000. In some embodiments, the first and second source/drain regions SD1 and SD2 may be formed by implanting impurities to the substrate 1000.

The gate electrode GE may be provided on the substrate 1000. The gate electrode GE may be provided between the first and second source/drain regions SD1 and SD2. The gate electrode GE may include a conductive material. For example, the gate electrode GE may include metal or polysilicon.

The gate insulating layer GI may be provided between the gate electrode GE and the substrate 1000. The gate insulating layer GI may be disposed between the gate electrode GE and the substrate 1000. The gate insulating layer GI may include an insulating material. For example, the gate insulating layer GI may include a Si oxide (e.g., $SiO_2$), an Al oxide (e.g., $Al_2O_3$), or a high dielectric material (e.g., $HfO_2$).

The interlayer insulating layer 2000 may be provided on the substrate 1000. The interlayer insulating layer 2000 may cover the gate electrode GE and the gate insulating layer GI. The interlayer insulating layer 2000 may include an insulating material. For example, the interlayer insulating layer 2000 may include a Si oxide (e.g., $SiO_2$), an Al oxide (e.g., $Al_2O_3$), or a high dielectric material (e.g., $HfO_2$).

The capacitor CE may be provided on the interlayer insulating layer 2000. The capacitor CE may include one of the capacitors 10, 11, 12, 13, 14, and 15 described with reference to FIGS. 1 to 6. However, a shape of the capacitor CE is not limited to those shown in FIGS. 1 to 6. For example, the shape of the capacitor CE may be selected as necessary within the scope including the technical concept described with reference to FIGS. 1 to 6.

The contact CT may be provided between the capacitor CE and the first source/drain region SD1 to penetrate the interlayer insulating layer 2000. The contact CT may electrically connect the capacitor CE and the first source/drain region SD1.

The capacitor CE according to one or more embodiments may include an electrode having a perovskite and high crystallinity. In this regard, a dielectric layer of the capacitor CE may have high crystallinity and high permittivity while having a perovskite crystal structure. The capacitor CE may have improved capacitance characteristics. As a result, according to one or more embodiments, provided may be the semiconductor device 20 including the capacitor CE having improved capacitance characteristics.

Figure 8:
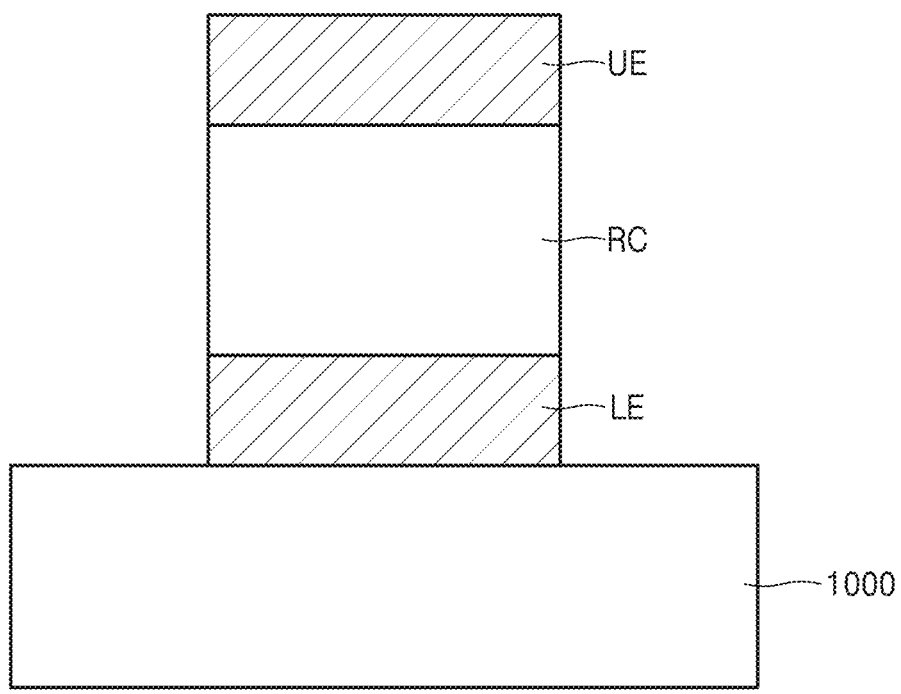
FIG. 8 is a cross-sectional view of a memory element according to some example embodiments.

FIG. 8 is a cross-sectional view of a memory element according to another exemplary embodiment. For briefness of descriptions, substantially the same description as those described with reference to FIGS. 1 to 6 will be omitted.

Referring to FIG. 8, provided may be a memory element 21. The memory element 21 may be an element that stores information in, e.g., a resistive random access memory (RRAM). The memory element 21 may include a substrate 1000, a lower electrode LE, a resistance change layer RC, and an upper electrode UE. The lower electrode LE, resistance change layer RC, and/or upper electrode UE may be memory elements that store information. The substrate 1000 may be substantially the same with the substrate 1000 described with reference to FIG. 7. In some embodiments, wiring, passive elements, and/or active elements may be provided on the substrate 1000. The lower electrode LE may be substantially the same with the first A electrode 100, first B electrode 110, or first C electrode 120 described above. The upper electrode UE may be substantially the same with the second A electrode 300, second B electrode 310, or second C electrode 320 described above.

The resistance change layer RC may be provided on the lower electrode LE. The resistance change layer RC may include a variable resistance material. The variable resistance material may refer to a material whose resistance changes according to the applied voltage. For example, the resistance change layer RC may be an insulating layer having a perovskite crystal structure. For example, the resistance change layer RC may include $PbZrTiO_3$, $PrCaMnO_3$, and/or calcium-doped $(Ba, Sr)TiO_3$.

Resistance change characteristics of the resistance change layer RC having a perovskite crystal structure may change according to crystallinity of the resistance change layer RC. For example, when the crystallinity of the resistance change layer RC is low, the resistance change characteristics may be deteriorated, and when the crystallinity of the resistance change layer RC is high, the resistance change characteristics may be maintained. The crystallinity of the resistance change layer RC may be influenced by crystallinity of the lower electrode LE and/or the upper electrode UE having a perovskite crystal structure. Thus, crystallinity of the lower electrode LE and the upper electrode UE may be required to be high to maintain the resistance change characteristics of the resistance change layer RC stable.

The lower electrode LE according to one or more embodiments (e.g., the first A electrode 100, first B electrode 110, and/or first C electrode 120) may include a first reinforcement material having a perovskite crystal structure and a first metallic material having a perovskite crystal structure and electronegativity greater (e.g., at least about 0.6 greater) than that of the first reinforcement material. Since the first dielectric material and the first metallic material both have high crystallinity, the lower electrode LE may also have high crystallinity. The upper electrode UE (e.g., the second A electrode 300, second B electrode 310, and/or second C electrode 320) may include a second reinforcement material having a perovskite crystal structure and a second metallic material having a perovskite crystal structure and electronegativity greater (e.g., at least about 0.6 times greater) than that of the second reinforcement material. Since the second reinforcement material and the second metallic material both have high crystallinity, the upper electrode UE may also have high crystallinity. In this regard, the resistance change layer RC may have high crystallinity.

As described above, according to one or more embodiments, provided may be a memory element 21 including a resistance change layer RC having high crystallinity.

The capacitors 10, 11, 12, 13, 14, and/or 15 may be manufactured by supplying metal precursors and an oxidizing agent onto a substrate, electrode, and/or dielectric layer, and allowing the metal precursor and the oxidizing agent to react to each other at an appropriate temperature. A process temperature may be appropriately adjusted according to thermal stability of the metal precursor and/or oxidizing agent.

FIGS. 9A-9H are views illustrating a method of manufacturing a capacitor according to some embodiments.

Figure 9A:
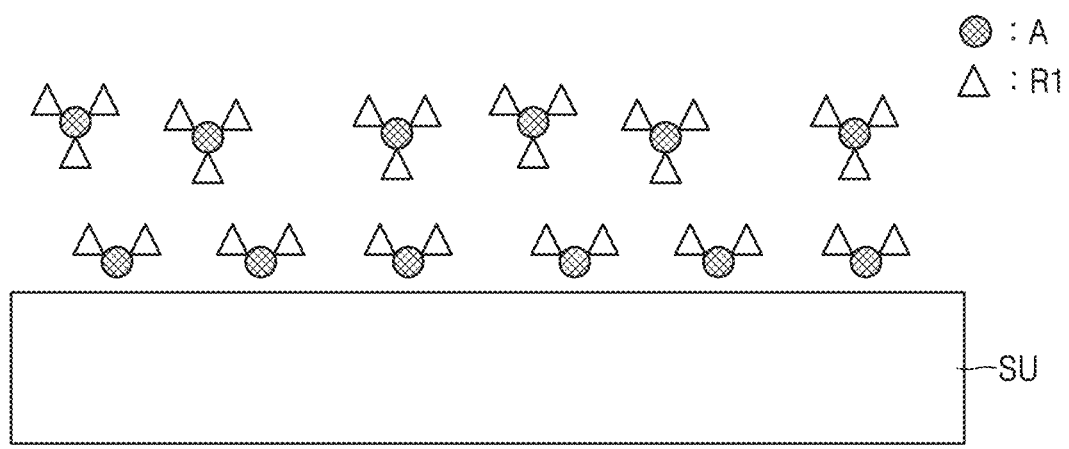
FIGS. 9A-9H are views illustrating a method of manufacturing a capacitor according to some embodiments.

For example, as shown in FIG. 9A, a first source including a first metal precursor may be supplied onto a substrate SU. The substrate SU may be and/or include a seed layer (not illustrated). The first metal precursor may be a metal-ligand compound represented by AR1. A may be the same as the above description, R1 may be one or two or more of a C1 to C10 alkyl group, a C2 to C10 alkenyl group, a carbonyl group (C=O), a halogen/halide, a C6 to C10 aryl group, a C6 to C10 cycloalkyl group, a C6 to C10 cycloalkenyl group, (C=O) R (R is a hydrogen or a C1 to C10 alkyl group), a C1 to C10 alkoxy group, C1 to C10 amidinates, C1 to C10 alkylamides, C1 to C10 alkylimides, —N(Q)(Q') (Q and Q' are independently a C1 to C10 alkyl group or a hydrogen), Q(C=O)CN (Q is a hydrogen or a C1 to C10 alkyl group), and/or C1 to C10 β-diketonates.

An atomic layer deposition (ALD) process may be used as the process of supplying the metal precursor. The process temperature may be set in consideration of thermal stability of the metal-ligand compound.

Figure 9B:
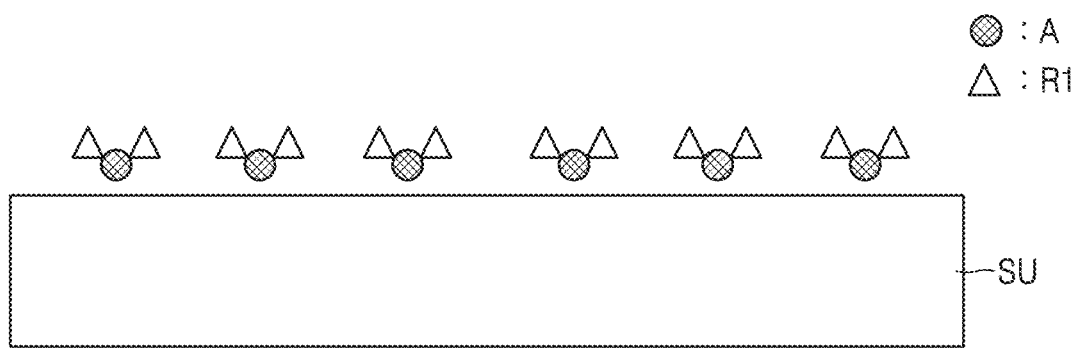

As shown in FIG. 9B, the metal-ligands are adsorbed onto the substrate SU. Then, residual ligands and/or reactive by-products are removed by purging. For purging, an inert gas such as $N_2$, Ar, He, and/or Ne gas may be used.

Next, whether additional AR1 is necessary or desired is determined. When additional AR1 supply is necessary (and/or otherwise desired), the supply and purge operations may be repeated.

A second source including a second metal precursor BR2 may be supplied. B may be the same as the above description, R2 may be one or two or more of a C1 to C10 alkyl group, a C2 to C10 alkenyl group, a carbonyl group (C=O), a halide, a C6 to C10 aryl group, a C6 to C10 cycloalkyl group, a C6 to C10 cycloalkenyl group, (C=O) R (R is a hydrogen or a C1 to C10 alkyl group), a C1 to C10 alkoxy group, C1 to C10 amidinates, C1 to C10 alkylamides, C1 to C10 alkylimides, —N(Q)(Q') (Q and Q' are independently a C1 to C10 alkyl group or a hydrogen), Q(C=O)CN (Q is a hydrogen or a C1 to C10 alkyl group), and/or C1 to C10 β-diketonates. For example, R1 and R-2 may represent the same and/or different ligands.

An atomic layer deposition (ALD) process may be used as the process of supplying the second source. The process temperature may be set in consideration of thermal stability of the metal-ligand compound.

Among the metal precursors provided to the reaction chamber and the ligands which are not adsorbed onto the substrate SU may be removed by purging. The purging may be and/or include a process of discharging ligands that do not participate in a reaction and/or ligands that are by-products after participating in the reaction to the outside. Inert gas such as Ar, He, Ne, or $N_2$ gas may be used for purging.

Figure 9C:
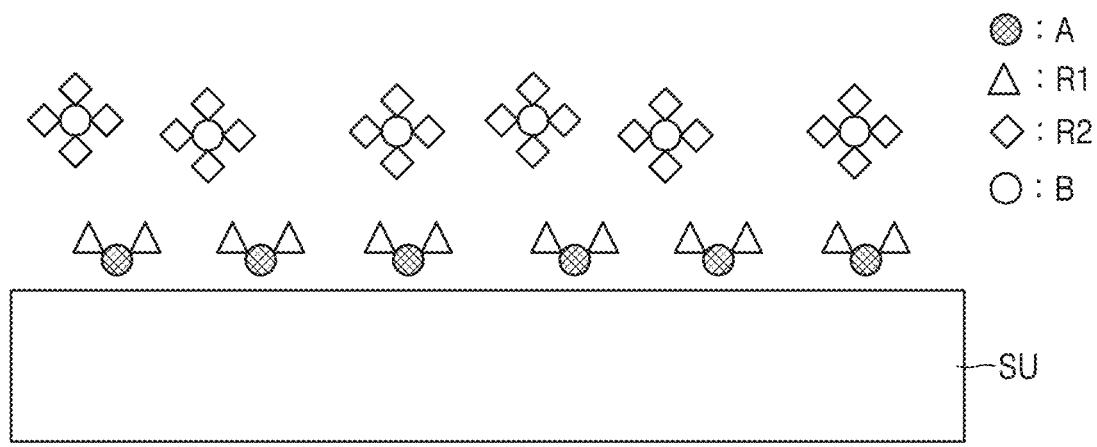
Figure 9D:
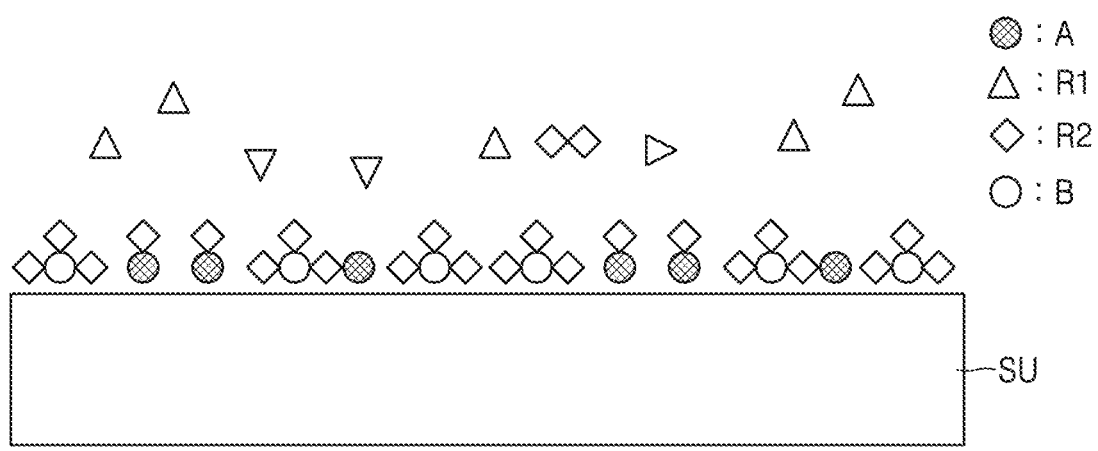
Figure 9E:
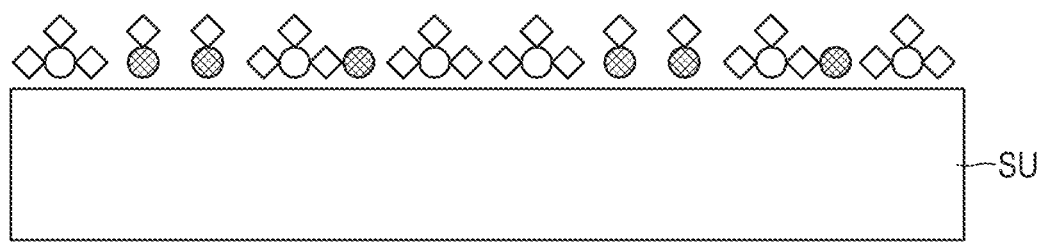

The supplying the second source including the ligands and the purging the residual ligands and the by-products are shown in FIGS. 9C to 9E. As shown in FIG. 9E, A supplied by the first source and B supplied by the second source are adsorbed onto the substrate SU.

Next, whether additional BR2 is necessary (and/or desired) is determined, and if necessary (and/or otherwise desired), the supply and purge operations may be repeated.

Figure 9F:
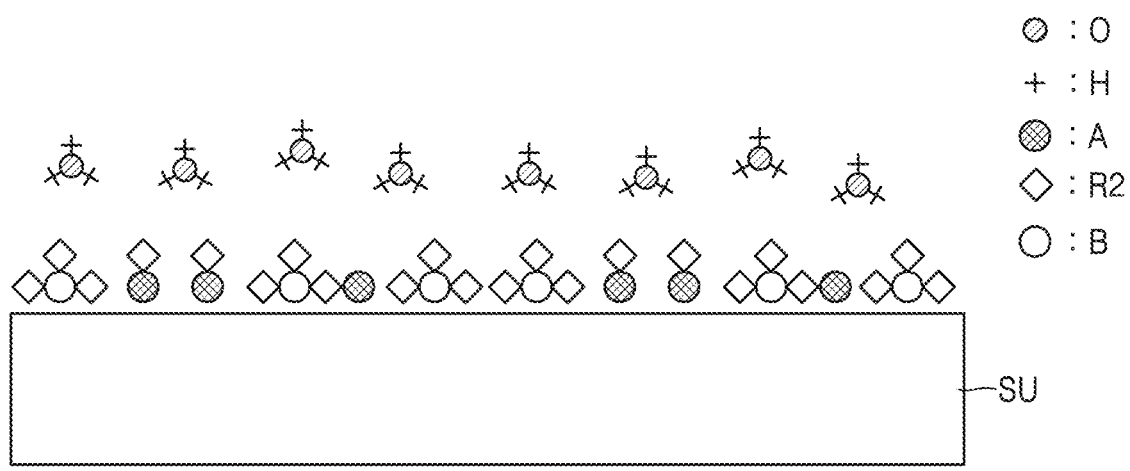
Figure 9G:
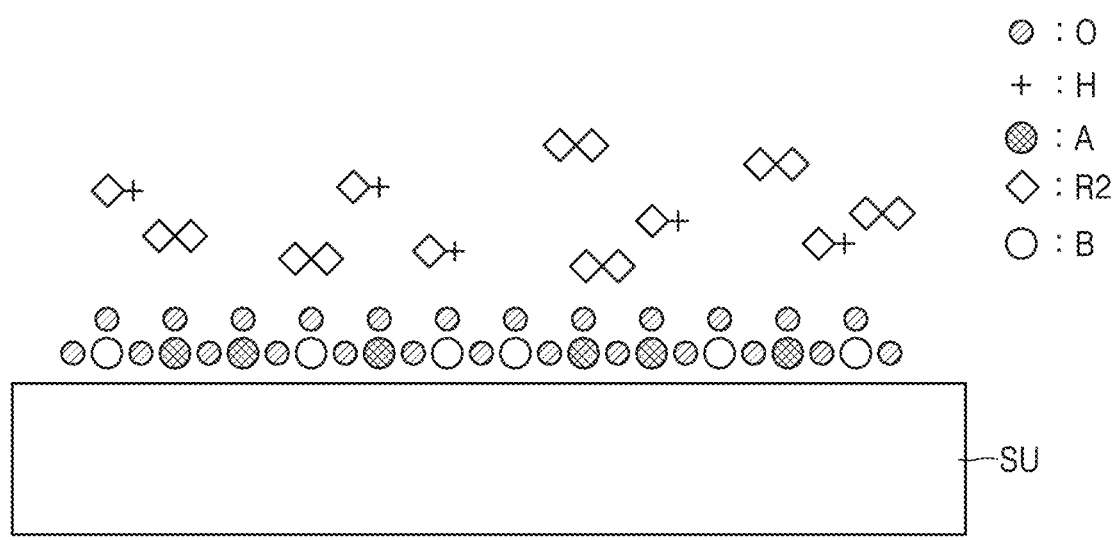
Figure 9H:
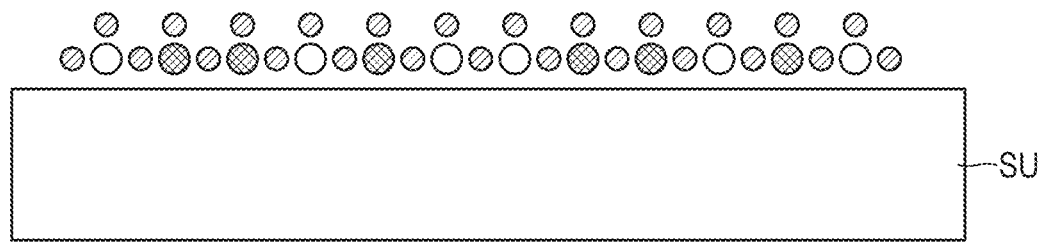

Next, as shown in FIG. 9F, an oxidizing agent is supplied. The ALD process may be used as the process of supplying the oxidizing agent. $O_3$, $H_2O$, $O_2$, $N_2O$, $O_2$, and/or plasma may be used as the oxidizing agent.

In some embodiments, for example wherein R2 is acting as a temporary stabilizer (e.g., bonding A and B), the oxidizing agent may react with A and/or B bonded with the stabilizer $R_2$, and an oxide represented by $ABO_3$ may be formed on the substrate SU. Reaction by-products are mostly vaporized by the process temperature.

After the reaction, the by-products, metal precursors, ligands, and/or oxidizers that do not react after being supplied to the substrate, may be removed by purging. An inert gas such as Ar, He, $N_2$, Ne, and/or the like may be used for purging.

The process may be repeated until the oxide layer reaches a desired thickness. A supper lattice structure and/or an alloy including $A_xA'_{(1-x)}BO_3$, $AB_yB'_{(1-y)}O_3$, and/or $A_xA'_{(1-x)}B_yB'_{(1-y)}O_3$ may be, respectively, produced by periodically replacing A with A' and/or B with B', and/or by supplying A and A' and/or B and B' at 1:1-x and 1:1-y ratios, respectively.

Though the above description is generally directed towards forming an electrode on a substrate SU, a similar process may be used in forming a dielectric layer on the electrode and/or a second electrode on a dielectric layer. For example, different metal precursors may be used to form the dielectric layer and/or the second electrode.

Figure 10:
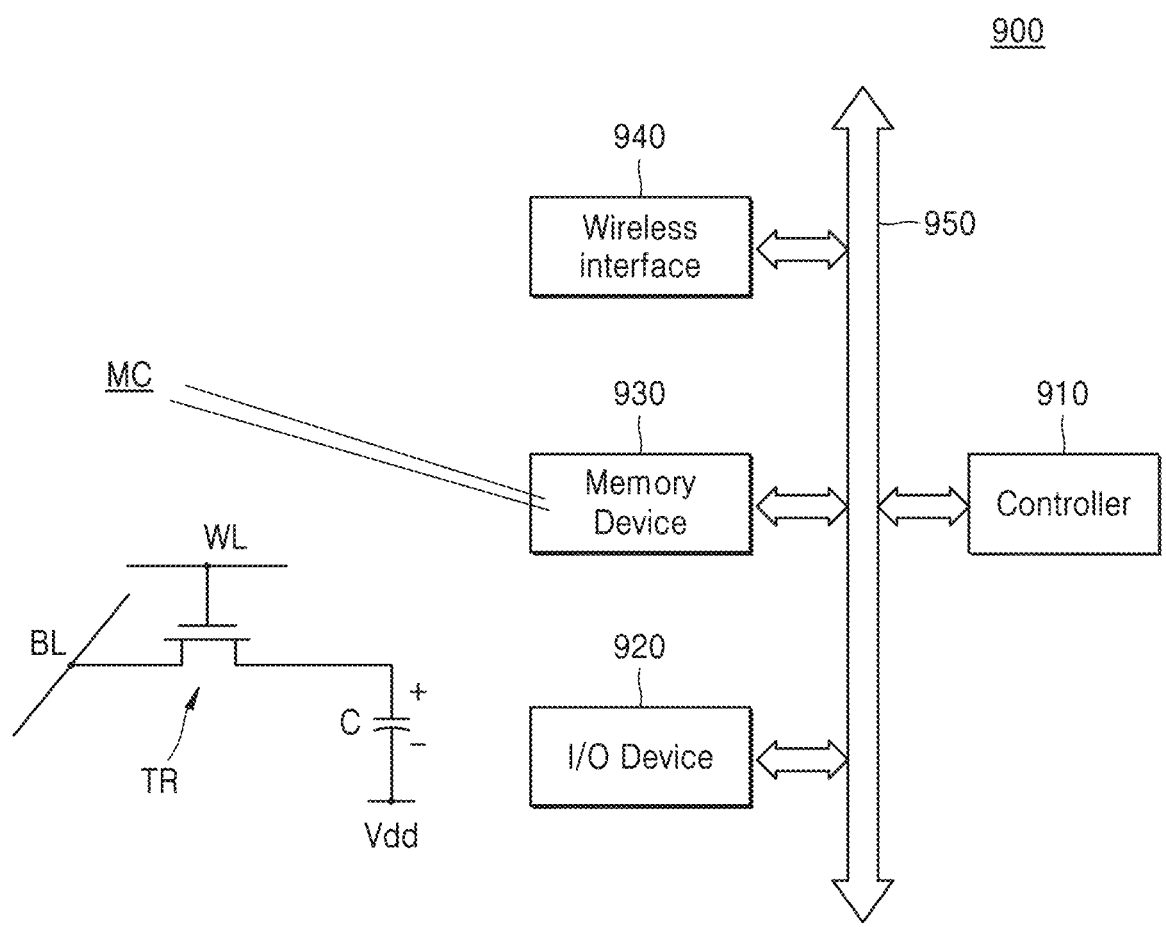
FIG. 10 is a schematic diagram for an electronic device including a capacitor according to some embodiments.

FIG. 10 is a schematic diagram for an electronic device including a capacitor according to some embodiments.

Referring to FIG. 10, an electronic device 900 according to some example embodiments may be a personal digital assistant (PDA), a laptop computer, a portable computer, a web tablet, a wireless phone, a mobile phone, a digital music player, a cable/wireless electronic device, etc., but is not limited thereto. The electronic device 900 may include a controller 910, an input/output (I/O) device 920 (e.g., a keypad, a keyboard and/or a display), a memory device 930, and a wireless interface unit 940 which are combined with each other through a data bus 950. For example, the controller 910 may include at least one of a microprocessor, a digital signal processor, a microcontroller, and/or other logic devices. The other logic devices may have a similar function to any one of the microprocessor, the digital signal processor, and the microcontroller. The memory device 930 may store, for example, commands performed by the controller 910. Additionally, the memory device 930 may also be used for storing a user data.

The memory device 930 includes a plurality of memory cells MC. Each of the memory cells MC may include a capacitor C connected to a transistor TR. A word line WL may be connected to a gate of the transistor TR. A bit line BL may be connected one source/drain region of the transistor TR and the capacitor C may be connected to the other source/drain region of the transistor TR. The other end of the capacitor C may be connected to a power supply voltage Vdd. inventive concepts. The capacitor C may include any of the capacitors 10, 11, 12, 13, 14, and/or 15 described in FIGS. 1 to 6 of the present application.

The electronic device 900 may use the wireless interface unit 940 in order to transmit data to a wireless communication network communicating with a radio frequency (RF) signal or in order to receive data from the network. For example, the wireless interface unit 940 may include an antenna or a wireless transceiver.

Figure 11:
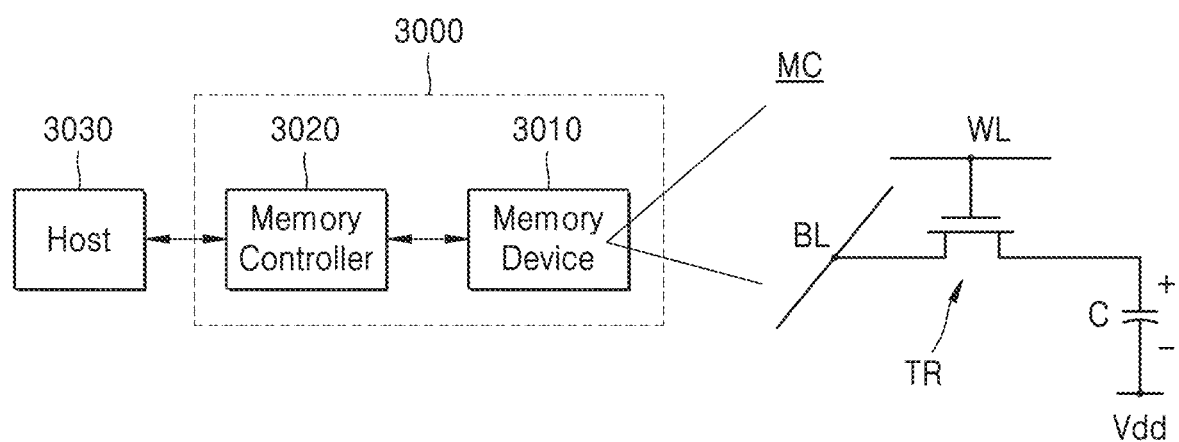
FIG. 11 is a schematic block diagram illustrating a memory system.

FIG. 11 is a schematic block diagram illustrating a memory system. Referring to FIG. 11, a memory system 3000 may include a memory device 303010 for storing massive data and a memory controller 3020. The memory controller 3020 may read or write data from/into the memory device 303010 in response to read/write request of a host 3030. The memory controller 3020 may make an address mapping table for mapping an address provided from the host 3030 (e.g., a mobile device or a computer system) into a physical address of the memory device 303010. The memory device 303010 may include a plurality of memory cells MC. Each of the memory cells MC may include a capacitor C connected to a transistor TR, and may have structure that is the same as the memory cell MC described in FIG. 10. For example, the capacitor C may be and/or include any of the capacitors 10, 11, 12, 13, 14, and/or 15 described in FIGS. 1 to 6 of the present application.

The functional units discussed above, such as the controller 910, the memory controller 3020, and/or host 3030, may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

Figure 12:
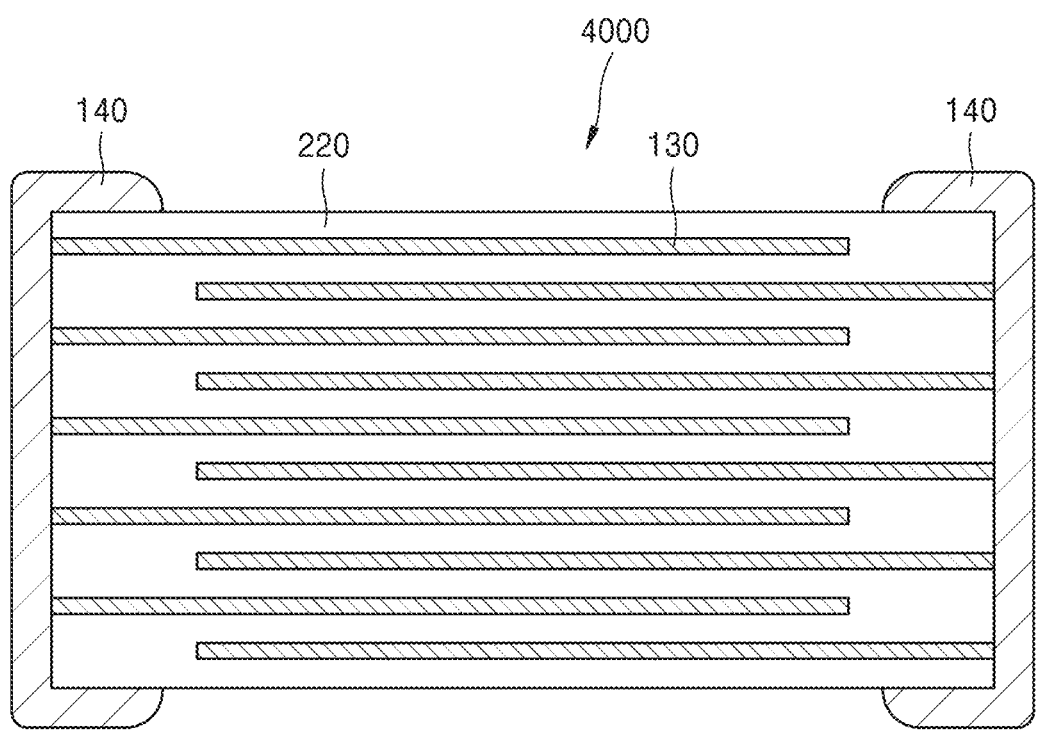
FIG. 12 is a schematic view of a multi-layered ceramic capacitor (MLCC) according to some embodiments.

FIG. 12 is a schematic view of a multi-layered ceramic capacitor (MLCC) according to some embodiments.

Referring to FIG. 12, a multi-layered capacitor 4000 according to some example embodiments may include: a plurality of internal electrodes 130; and a dielectric material layer 220 alternately disposed between the plurality of internal electrodes 130. The multi-layered capacitor 4000 may have a structure in which the plurality of internal electrodes 130 and the dielectric material layer 220 are alternately stacked. The plurality of internal electrodes 130 may be substantially the same as the first A electrode 100, first B electrode 110, or first C electrode 120 described above. The dielectric material layer 220 may be substantially the same as the first dielectric layer 200 and/or the second dielectric layer 210 described above.

The adjacent internal electrodes 130 may be electrically separated from one another by the dielectric material layer 220 therebetween. The multi-layered capacitor 4000 may act as a single unit capacitor. In the multi-layered capacitor 1, the number of the internal electrodes 130 and the number of the dielectric material layers 220, which are alternately stacked, may each independently be, for example, 2 or greater, 5 or greater, 10 or greater, 20 or greater, 50 or greater, 100 or greater, 200 or greater, 500 or greater, 1,000 or greater, 2,000 or greater, 5,000 or greater, or 10,000 or greater. As the number of the stacked internal electrodes 130 and the dielectric material layer 220 increases, a contact area thereof may increase, thus improving the capacitance.

The plurality of internal electrodes 130, which are alternately stacked to partially protrude in the directions of opposing side surfaces of the multi-layered capacitor 1, may be electrically connected to external electrodes 13. The external electrodes 140 may include, for example, an electrode layer contacting the multi-layered structure and the internal electrodes 130 and consisting of Ni, and a plating layer on the electrode layer.

The multi-layer capacitor 4000 according to one or more embodiments may include internal electrodes having a perovskite and high crystallinity. In this regard, a dielectric layer of the multi-layer capacitor 4000 may have high crystallinity and high permittivity while having a perovskite crystal structure. The multi-layer capacitor 4000 may have improved capacitance characteristics.

The above description of embodiments of the technical concept of the present disclosure provides an example for description of the technical concept of the present disclosure. Therefore, the technical concept of the present disclosure is not limited to the above embodiments, but it is clear that various modifications and changes such as combining the above embodiments may be made by one of ordinary skill in the art within the scope of the technical concept of the present disclosure.

According to one or more embodiments, an electrode that maintains a perovskite crystal structure stable may be provided.

According to one or more embodiments, a dielectric layer that maintains a perovskite crystal structure stable may be provided.

According to one or more embodiments, a dielectric layer having high permittivity may be provided.

According to one or more embodiments, a capacitor having improved capacitance characteristics may be provided.

According to one or more embodiments, a semiconductor device including a capacitor having improved capacitance characteristics may be provided.

However, effects of one or more embodiments are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
   a first electrode including a first reinforcement material having a perovskite crystal structure, and a first metallic material having a perovskite crystal structure;
   a second electrode on the first electrode; and
   a dielectric layer between the first electrode and the second electrode,
   wherein the first metallic material has a greater electronegativity than that of the first reinforcement material, and
   a lowermost surface and an uppermost surface of the first electrode include the first reinforcement material.

2. The capacitor of claim 1, wherein
   the first electrode has a superlattice structure comprising first unit layers and second unit layers that are alternately stacked,
   wherein the first unit layers comprise the first reinforcement material, and
   the second unit layers comprise the first metallic material.

3. The capacitor of claim 1, wherein
   the first electrode comprises an alloy of the first reinforcement material and the first metallic material, and
   the alloy has a perovskite crystal structure.

4. The capacitor of claim 3, wherein
   the alloy is represented by at least one of $A_xA'_{(1-x)}BO_3$, $AB_yB'_{(1-y)}O_3$, or $A_xA'_{(1-x)}B_yB'_{(1-y)}O_3$,
   where x and y are each 0.5 or less.

5. A semiconductor device comprising:
   a capacitor comprising a first electrode including a first reinforcement material having a perovskite crystal structure and a first metallic material having a perovskite crystal structure, a second electrode on the first electrode, and a dielectric layer between the first electrode and the second electrode; and
   a transistor comprising a first source/drain region electrically connected to the first electrode, a second source/drain region, and a gate structure between the first source/drain region and the second source/drain region,
   wherein the first metallic material has a greater electronegativity than that of the first reinforcement material, and
   a lowermost surface and an uppermost surface of the first electrode include the first reinforcement material.

6. The semiconductor device of claim 5, wherein
   the first electrode has a superlattice structure comprising first unit layers and second unit layers that are alternately stacked,
   wherein the first unit layers comprise the first reinforcement material, and
   the second unit layers comprise the first metallic material.

7. The semiconductor device of claim 5, wherein the first electrode comprises an alloy of the first reinforcement material and the first metallic material.

8. The semiconductive device of claim 7, wherein the alloy has a perovskite crystal structure.

* * * * *